(12) United States Patent
Cho et al.

(10) Patent No.: US 9,046,252 B2
(45) Date of Patent: Jun. 2, 2015

(54) LED LAMP

(75) Inventors: Jae Ho Cho, Seoul (KR); Jung Yun Kim, Seoul (KR); Kang Hyun Cho, Seoul (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 648 days.

(21) Appl. No.: 12/160,836

(22) PCT Filed: Jan. 10, 2007

(86) PCT No.: PCT/KR2007/000171
§ 371 (c)(1),
(2), (4) Date: Oct. 14, 2008

(87) PCT Pub. No.: WO2007/081152
PCT Pub. Date: Jul. 19, 2007

(65) Prior Publication Data
US 2009/0218586 A1    Sep. 3, 2009

(30) Foreign Application Priority Data

Jan. 13, 2006 (KR) .................. 10-2006-0003856

(51) Int. Cl.
| | | |
|---|---|---|
| *H01L 27/14* | (2006.01) | |
| *F21V 29/00* | (2006.01) | |
| *H05K 3/32* | (2006.01) | |
| *F21S 8/10* | (2006.01) | |
| *F21V 19/04* | (2006.01) | |
| *F21Y 101/02* | (2006.01) | |

(52) U.S. Cl.
CPC ......... *F21V 29/004* (2013.01); *F21S 48/1104* (2013.01); *F21S 48/328* (2013.01); *F21V 19/04* (2013.01); *F21V 29/2212* (2013.01); *F21Y 2101/02* (2013.01); *H05K 3/325* (2013.01); *H05K 2201/09063* (2013.01); *H05K 2201/10106* (2013.01); *H05K 2201/10651* (2013.01); *H05K 2203/167* (2013.01)

(58) Field of Classification Search
None
See application file for complete search history.

(56) References Cited

U.S. PATENT DOCUMENTS

| | | | | | |
|---|---|---|---|---|---|
| 4,203,129 | A | * | 5/1980 | Oktay et al. | 257/713 |
| 4,415,025 | A | * | 11/1983 | Horvath | 165/185 |
| 4,748,495 | A | * | 5/1988 | Kucharek | 257/713 |
| 5,345,107 | A | * | 9/1994 | Daikoku et al. | 257/717 |
| 5,751,062 | A | * | 5/1998 | Daikoku et al. | 257/722 |
| 6,020,597 | A | * | 2/2000 | Kwak | 257/48 |
| 6,345,902 | B2 | | 2/2002 | Ohkohdo et al. | |
| 6,351,034 | B1 | * | 2/2002 | Farnworth et al. | 257/727 |

(Continued)

FOREIGN PATENT DOCUMENTS

| | | | |
|---|---|---|---|
| JP | 3141766 A | * | 5/2008 |
| KR | 10-2003-0097277 | | 12/2003 |
| KR | 10-2005-0119744 | | 12/2005 |

*Primary Examiner* — David E Graybill
(74) *Attorney, Agent, or Firm* — H.C. Park & Associates, PLC

(57) ABSTRACT

The present invention relates to a light emitting diode (LED) lamp, and an object of the present invention is to provide an LED lamp in which an LED can be easily exchanged and external vibration can be absorbed to prevent the play thereof. To this end, an LED lamp according to the present invention comprises an LED package having a lead frame; a printed circuit board separated from the LED package and having a conductive pattern formed on a surface thereof facing the lead frame; and a pressing means for pressing the LED package toward the PCB so that the lead frame is in contact with the conductive pattern.

13 Claims, 3 Drawing Sheets

(56) References Cited

U.S. PATENT DOCUMENTS

| | | | |
|---|---|---|---|
| 6,428,189 B1* | 8/2002 | Hochstein | 362/373 |
| 6,490,161 B1* | 12/2002 | Johnson | 361/704 |
| 6,656,754 B1* | 12/2003 | Farnworth et al. | 438/15 |
| 6,867,976 B2* | 3/2005 | Belady et al. | 361/704 |
| 6,891,730 B2* | 5/2005 | Farassat | 361/769 |
| 6,999,318 B2* | 2/2006 | Newby | 361/719 |
| 7,262,969 B2* | 8/2007 | Lee et al. | 361/704 |
| 7,977,698 B2* | 7/2011 | Ling et al. | 257/99 |
| 2003/0214028 A1* | 11/2003 | Brechignac et al. | 257/706 |
| 2005/0024834 A1* | 2/2005 | Newby | 361/719 |
| 2006/0202325 A1* | 9/2006 | Coico et al. | 257/718 |

* cited by examiner

LED LAMP

CROSS REFERENCE TO RELATED APPLICATIONS

This application is the National Stage of International Application No. PCT/KR2007/000171, filed Jan. 10, 2007, and claims priority from and the benefit of Korean Patent Application No. 10-2006-0003856, filed on Jan. 13, 2006, which are both hereby incorporated by reference for all purposes as if fully set forth herein.

BACKGROUND OF THE INVENTION

1. Field of the Invention

The present invention relates to a light emitting diode (LED) lamp, and more particularly, to an LED lamp in which an LED can be easily exchanged and external vibration can be absorbed to prevent excess free play therein.

2. Discussion of the Background

Generally, an LED is an electronic device that emits light through recombination of injected minority carriers (electrons or holes) using a p-n junction of a semiconductor. That is, when electric power is applied to a semiconductor of a specific element in a forward direction, electrons and holes move through the junction of positive and negative electrodes, and are recombined with each other and then have energy lower than those of separate electrons and holes. The difference in energy generated at this time causes light to be emitted.

Such an LED has a smaller size and a longer life span and can emit light with high efficiency using a lower voltage as compared with conventional light sources. In particular, since LEDs have a rapid response property, they are widely used for indicator lamps or digit indicators of various electronic equipment, such as indicators of instrument panels of automobiles or light sources for fiber optic communication, and are also applied in different ways, such as lighting means for houses, vehicles, ships, traffic signals, a variety of guide lights, exit sign lights, and the like.

FIG. 1 is a perspective view showing a printed circuit board (PCB) to which LED chips are mounted using surface mount technology, and FIG. 2 is a perspective view showing a PCB to which LED packages are mounted by means of clinching.

Since a single LED chip or package cannot give sufficient illuminance and luminance, an LED lamp includes about 20 or more LED chips or packages (the number thereof varies depending on use of the lamp) that are arranged in parallel or in series to form a circuit.

Among LED lamps, the LED lamp of FIG. 1 is manufactured using surface mount technology (SMT) in such a manner that LED chips are mounted directly on a PCB and then fixed thereto by means of soldering.

However, in the LED lamp manufactured using SMT as described above, there is inconvenience in that if an LED chip is out of order, solder used for fixing the LED chip should be removed and then a new LED chip should be soldered again upon mounting thereof. In addition, if external vibration is applied thereto, there is a high possibility that a copper plate of the PCB will be separated due to the vibration.

Meanwhile, the LED lamp of FIG. 2, which is made by means of clinching, does not require additional soldering since lead frames of the LED package are attached to the PCB by means of clinching.

However, since the LED lamp made by means of clinching has a plurality of LED packages connected in series, the LED lamp has a disadvantage in that the entire module should be replaced even though only one LED package is out of order. In addition, since the LED packages are attached through clinching, there is a high possibility that a circuit on the PCB will be short-circuited.

SUMMARY OF THE INVENTION

Accordingly, the present invention is conceived to solve the aforementioned problems. It is an object of the invention to provide an LED lamp in which LED packages are provided separately from a PCB, lead frames of each of the LED packages can be always in contact with the PCB, and the LED package can be easily replaced when required.

In addition, another object of the present invention is to provide an LED lamp provided with an elastic member for elastically biasing LED packages toward a PCB so that the LED packages or the PCB is not influenced by external vibration.

An LED lamp according to the present invention comprises an LED package having a lead frame; a printed circuit board separated from the LED package and having a conductive pattern formed on a surface thereof facing the lead frame; and a pressing means for pressing the LED package toward the PCB so that the lead frame is in contact with the conductive pattern.

A fixing hole may be formed in one of the lead frame and the PCB, and a fixing member that is to be at least partially inserted into the fixing hole may be formed on the other one of the lead frame and the PCB. A heat sink may be formed on a lower surface of the LED package such that the heat sink is outwardly exposed, a heat dissipation plate may be provided at a position spaced apart by a predetermined distance from the heat sink, and the pressing means may be installed to be interposed between and brought into contact with the heat sink and the heat dissipation plate. The pressing means may comprise an elastic member. A fixing shaft for fixing the elastic member may protrude upward from an upper portion of the heat dissipation plate. The PCB may comprise first and second PCBs that are separate from and spaced apart from each other so that the LED package is exposed in a light emitting direction. Alternatively, the PCB may have an opening portion for exposing the LED package in a light emitting direction.

Since the LED lamp of the present invention includes the LED package and the PCB that are separate from each other and is constructed such that the lead frame of the LED package can be always in contact with the PCB, it is possible to replace only a desired LED package, if necessary. In addition, since the LED lamp of the present invention includes the elastic member between the heat dissipation plate and LED package, even when external vibration is applied, the vibration is prevented from being transmitted to the LED package or PCB.

DETAILED DESCRIPTION OF THE ILLUSTRATED EMBODIMENTS

Hereinafter, preferred embodiments of the present invention will be described in detail with reference to the accompanying drawings.

Figure 1:
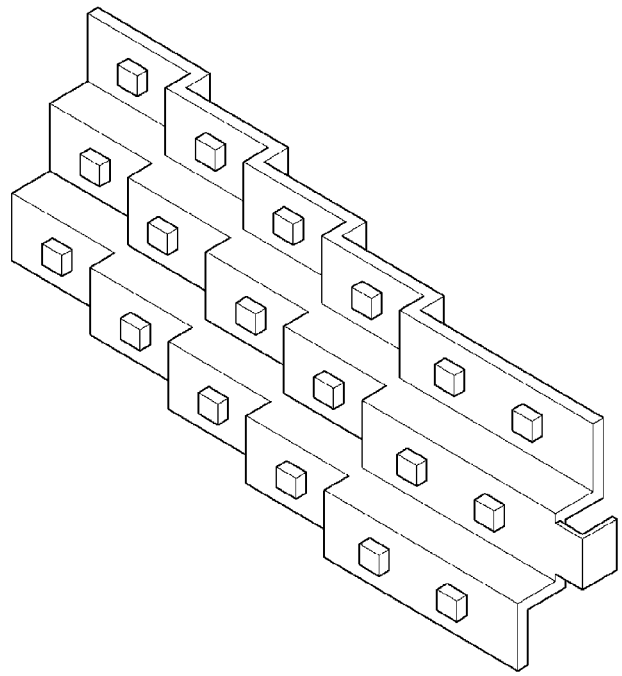
FIG. 1 is a perspective view showing a PCB to which LED chips are mounted using surface mount technology.
Figure 2:
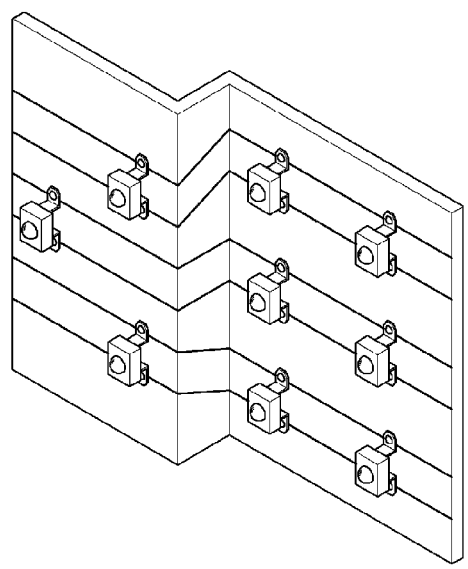
FIG. 2 is a perspective view showing a PCB to which LED packages are mounted by means of clinching.
Figure 3:
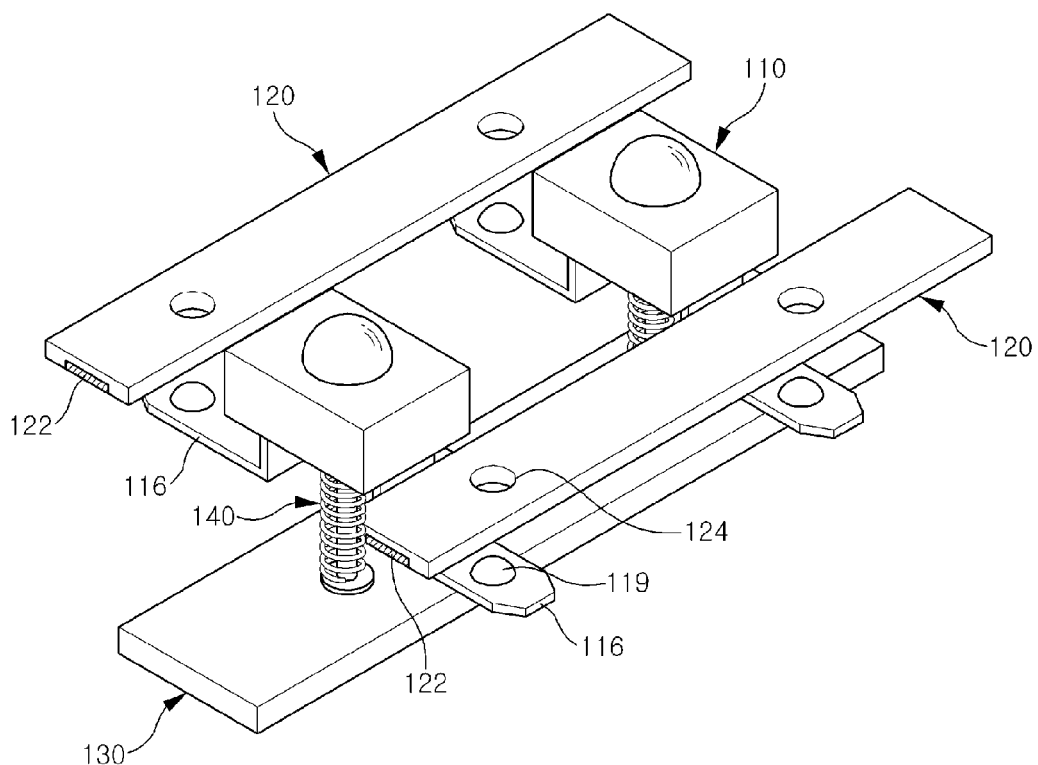
FIG. 3 is a perspective view showing an LED lamp according to an embodiment of the present invention.
Figure 4:
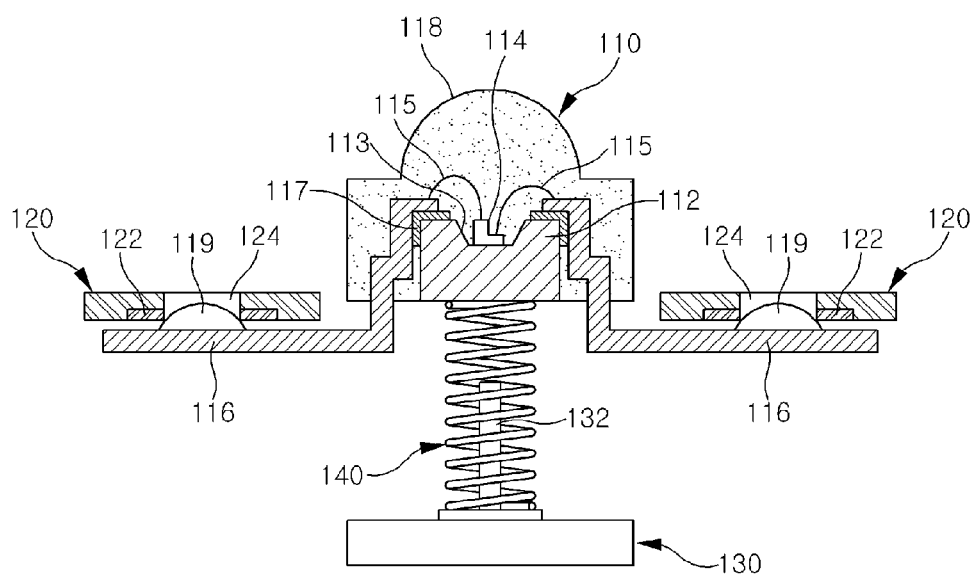
FIG. 4 is a sectional view showing the LED lamp of FIG. 3.

FIG. 3 is a perspective view showing an LED lamp according to an embodiment of the present invention, and FIG. 4 is a sectional view showing the LED lamp of FIG. 3.

As shown in FIGS. 3 and 4, the LED lamp of this embodiment includes a plurality of LED packages 110, a PCB 120 for supplying power to the LED packages 110, and a heat dissipation plate 130 for dissipating heat, which is generated when the LED packages 110 emit light, to the outside.

Now, the respective components will be explained in greater detail.

Each of the LED packages 110 includes a metal slug 112 that is a kind of heat sink having thermal conductivity, an LED chip 114 mounted to the metal slug 112 to generate various light according to properties of its material when power is applied in a forward direction, lead frames 116 for supplying power to the LED chip 114, and a molding portion 118 for protecting the LED chip 114.

The metal slug 112 absorbs and dissipates the heat generated from the LED chip 114. The metal slug 112 is generally made of a metallic material and formed to take the shape of a rectangular rod by means of molding. However, the shape of the metal slug 112 is not limited thereto but may take a variety of shapes such as a cylinder, an elliptical rod and a polygonal rod.

A concave portion 113 depressed with a predetermined depth is formed at the center of an upper surface of the metal slug 112, and the LED chip 114 is mounted in the concave portion 113. The LED chip 114 mounted in the concave portion 113 is a horizontal type LED chip that has a two-tap wire structure using two wires 115 for connection to the pair of lead frames 116.

In this embodiment, another member such as the metal slug 112 may be further provided together with the pair of lead frames 116. In this case where the metal slug 112 is further provided as mentioned above, there is an advantage in that the heat generated from the LED chip 114 can be rapidly dissipated to the outside.

Although the LED chip 114 mounted in the concave portion 113 in this embodiment has been described by way of example as being a horizontal type LED chip, the present invention is not limited thereto but may employ various kinds of LED chips such as a vertical type LED chip. In addition, although the connection structure between the LED chip 114 and the lead frames 116 in this embodiment has been described by way of example as being a two-tap wire structure, the present invention is not limited thereto but may employ various structures such as a one-tap wire structure.

Meanwhile, an insulation film 117 is provided near an edge of the metal slug 112 so as to insulate some portions of upper and side surfaces of the metal slug 112, and one end of each of the lead frames 116 is bonded to an upper portion of the insulation film 117. That is, one end of the lead frame 116 is bent along the upper and side surfaces of the metal slug 112, but the lead frame 116 is electrically isolated from the metal slug 112 due to the formation of the insulation film 117 therebetween.

Here, although not shown in the figures, a recess is preferably formed in a lower surface of the metal slug 112 so that a portion of an elastic member 140, which will be explained later, can be inserted therein. In the case where a portion of the elastic member 140 is inserted into the metal slug 112 as mentioned above, it is possible to prevent the play of the metal slug 112 and to increase a contact area, resulting in more rapid heat dissipation.

The PCB 120 is provided to supply power to the LED packages 110 while being separated from the LED packages 110. In this embodiment, the PCB 120 comprises a pair of divided PCBs 120 and 120 that are spaced apart from each other so that the LED package 110 is exposed in a light emitting direction. The pair of divided PCBs 120 is arranged to be elongated in one direction and in parallel with each other, and placed on the pair of lead frames 116 provided in the LED package 110. Since the PCB 120 should supply power through the lead frames 116, a conductive pattern 122 is formed on a surface of the PCB 120 facing the lead frames, i.e., on a lower surface of the PCB 120, in this embodiment.

In addition, at a region where the PCB 120 and the lead frame 116 are in contact with each other, a fixing hole 124 and a fixing member 119 that is to be at least partially inserted into the fixing hole 124 are formed. In this embodiment, the fixing member 119 is formed on the lead frame 116, and the fixing hole 124 is formed in the PCB 120.

The fixing member 119 and the fixing hole 124 are means for ensuring that the lead frame 116 is in secure contact with the PCB 120. Preferably, the fixing member 119 is formed to protrude in a hemispherical shape, and the fixing hole 124 is formed as a circular through-hole. Further, most preferably, the fixing member 119 has a size greater than that of the fixing hole 124 so that only a portion of the fixing member 119 is inserted into the fixing hole 124.

At this time, the positions of the fixing member 119 and the fixing hole 124 may be exchanged. That is, the fixing hole may be formed in the lead frame 116 and the fixing member 119 may be formed on the PCB 120.

The heat dissipation plate 130 is formed to be elongated in the same direction as the PCB 120, and has a plurality of fixing shafts 132 formed on an upper surface thereof. Moreover, the elastic member 140 that is a kind of pressing means for elastically biasing the LED package 110 toward the PCB 120 is engaged with one of the fixing shafts 132.

Upper and lower portions of the elastic member 140 are respectively brought into contact with the lower surface of the metal slug 112 of the LED package 110 and the heat dissipation plate 130, so that the heat generated from the LED chip 114 can be transferred to the heat dissipation plate 130. At this time, if a recess (not shown) into which a portion of the elastic member 140 is inserted is formed in the lower surface of the metal slug 112 as mentioned above, heat dissipation efficiency can be further improved. Further, it is possible to prevent the play of the LED package 110.

As for a coupling structure of the LED lamp according to the present invention constructed as above, the heat dissipation plate 130 is provided at the lowermost position. As described above, the heat dissipation plate 130 is formed to be elongated in one direction (in a lengthwise direction of the PCB 120), and the plurality of fixing shafts 132 are formed to protrude upward on the upper surface of the heat dissipation plate and at regular intervals in a lengthwise direction of the heat dissipation plate 130.

In addition, the elastic member 140 is engaged with each of the fixing shafts 132, and the LED package 110 that is to come into contact with the elastic member 140 is positioned above the elastic member 140. At this time, the number of the LED packages 110 is identical to the number of the fixing shafts 132, and the upper portion of the elastic member is in contact with the metal slug 112 exposed below the LED package 110.

Meanwhile, since the divided PCBs 120 are positioned respectively on the upper surfaces of the lead frames 116 in a pair, which protrude beyond both sides of the LED package 110, the lead frames 116 of the LED package 110 elastically biased upward by the elastic member 140 are brought into contact with the conductive pattern 122 formed on the lower surfaces of the divided PCBs 120.

At this time, since the fixing hole 124 is formed in the PCB 120 and the fixing member 119 is formed on the lead frame 116 as mentioned above, the PCB and the lead frame can be in more secure contact with each other.

In addition, even though external vibration is applied, the elastic member 140 absorbs the vibration so that the vibration cannot have an influence on either the LED package 110 or the PCB 120.

Furthermore, with the above coupling structure, when only one LED package is defective, it is possible to replace only the LED package. In addition, upon replacement of an LED package 110, it is sufficient to only separate the LED package 110 from the PCB 120, leading to easier replacement.

Here, the LED packages may be arranged in several rows rather than in one horizontal row, and one or two PCBs may be provided between rows of LED packages. In addition, in such an arrangement, the LED packages may be mounted in alternate vertical rows. Although not described above, the LED lamp may be configured by means of various methods in addition to the aforementioned method. An example of LED lamps configured by means of the various methods, i.e., another embodiment of the present invention, is shown in the plan view of FIG. 5.

Figure 5:
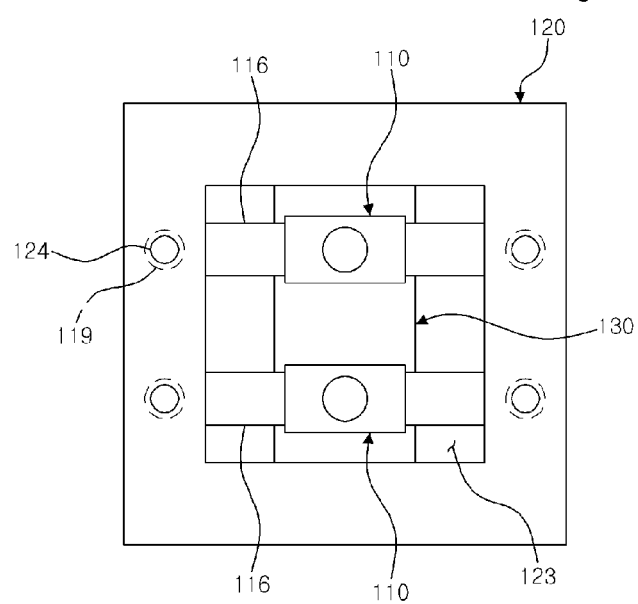
FIG. 5 is a plan view showing an LED lamp according to another embodiment of the present invention.

Referring to FIG. 5, the LED lamp of this embodiment includes an opening portion 123 formed in a single PCB 120 so that LED packages 110 can be exposed in a light emitting direction, i.e., upward, contrary to the previous embodiment in which the divided PCBs 120 are provided to be spaced with each other. Although FIG. 5 shows that two LED packages 110 are exposed upward through the opening portion 123, the number of LED packages 110 is not specifically limited in the present invention.

Except that the structure in which the opening portion 123 is formed in the PCB 120 to expose the LED packages 110 upward, other structures of the LED lamp of this embodiment are substantially identical to those of the previous embodiment. Thus, detailed descriptions of the other structures will be omitted. Reference numerals of FIG. 5, which are denoted therein but have not been explained, designate components identical to those of the previous embodiment.

Although the configurations and applications of the LED lamps according to preferred embodiments of the present invention have been described with reference to the accompanying drawings, it will be understood by those skilled in the art that the configurations and applications have been described only for illustrative purposes and various changes and modifications can be made thereto without departing from the spirit and scope of the invention.

The invention claimed is:

1. A light emitting diode (LED) lamp, comprising:
 an LED package comprising:
  a heat sink having an upper surface and a lower surface;
  an LED chip disposed on the upper surface of the heat sink; and
  a lead frame electrically connected to the LED chip, a portion of the lead frame being disposed under the lower surface of the heat sink;
 a printed circuit board (PCB) separated from the LED package and having a conductive pattern formed on a surface thereof facing the lead frame; and
 a pressing element configured to press the LED package toward the PCB so that the lead frame is in contact with the conductive pattern,
 wherein the pressing element is configured to contact the heat sink of the LED package when the lead frame is in contact with the conductive pattern.

2. The LED lamp as claimed in claim 1, wherein a fixing hole is formed in one of the lead frame and the PCB, and a fixing member is formed on the other one of the lead frame and the PCB, the fixing member being at least partially inserted into the fixing hole.

3. The LED lamp as claimed in claim 1, further comprising a heat dissipation plate provided at a position spaced apart by a distance from the heat sink,
 wherein:
  the heat sink is formed on a lower surface of the LED package such that the heat sink is outwardly exposed; and
  the pressing element is interposed between and brought into contact with the heat sink and the heat dissipation plate.

4. The LED lamp as claimed in claim 1, wherein the pressing element comprises an elastic member.

5. The LED lamp as claimed in claim 4, further comprising a fixing shaft for fixing the elastic member, the fixing shaft being arranged to protrude upward from an upper portion of the heat dissipation plate.

6. The LED lamp as claimed in claim 1, wherein the PCB comprises first and second PCBs that are spaced apart from each other so that the LED package is exposed in a light emitting direction.

7. The LED lamp as claimed in claim 1, wherein the PCB has an opening portion for exposing the LED package in a light emitting direction.

8. The LED lamp as claimed in claim 2, wherein the fixing member is larger than the fixing hole.

9. The LED lamp as claimed in claim 6, wherein the first and second PCBs are elongated in one direction and parallel with each other.

10. The LED lamp as claimed in claim 3, wherein the heat dissipation plate is elongated in one direction.

11. The LED lamp as claimed in claim 3, wherein the heat sink and the heat dissipation plate are arranged on the same side of the LED package.

12. A light emitting diode (LED) lamp, comprising:
 an LED package comprising:
  a heat sink formed on a lower surface of the LED package, the heat sink having an upper surface and a lower surface;
  an LED chip disposed on the upper surface of the heat sink; and
  a lead frame electrically connected to the LED chip, a portion of the lead frame being disposed under the lower surface of the heat sink;
 a printed circuit board (PCB) separated from the LED package and having a conductive pattern formed on a surface thereof facing the lead frame;
 a pressing element configured to press the LED package toward the PCB so that the lead frame is in contact with the conductive pattern;
 and
 a heat dissipation plate arranged at a position spaced apart from the heat sink and on the same side of the LED package as the heat sink, wherein the pressing element is configured to contact the heat sink of the LED package when the lead frame is in contact with the conductive pattern.

13. A light emitting diode (LED) lamp, comprising:
an LED package comprising:
- a heat sink comprising an upper surface and a lower surface;
- an LED chip disposed on the upper surface of the heat sink; and
- a lead frame electrically connected to the LED chip, a portion of the lead frame being disposed under the lower surface of the heat sink;

first and second printed circuit boards (PCBs) that are spaced apart from each other and the LED package, each of the first and second PCBs having a conductive pattern formed on a surface thereof facing the lead frame; and a pressing element configured to press the LED package toward the first and second PCBs so that the lead frame is in contact with the conductive pattern on each of the PCBs, wherein the pressing element is configured to contact the heat sink of the LED package when the lead frame is in contact with the conductive pattern in each of the PCBs.

* * * * *